United States Patent [19]

Siebold

[11] Patent Number: 5,012,192
[45] Date of Patent: Apr. 30, 1991

[54] GRADIENT COIL SYSTEM FOR A NUCLEAR RESONANCE TOMOGRAPHY APPARATUS

[75] Inventor: Horst Siebold, Erlangen, Fed. Rep. of Germany

[73] Assignee: Siemens Aktiengesellschaft, Berlin and Munich, Fed. Rep. of Germany

[21] Appl. No.: 442,077

[22] Filed: Nov. 28, 1989

[30] Foreign Application Priority Data

Nov. 28, 1988 [EP] European Pat. Off. ............ 88119828

[51] Int. Cl.$^5$ ............................................. G01R 33/20
[52] U.S. Cl. ...................................... 324/318; 335/299
[58] Field of Search ........................ 324/318, 319, 320; 335/299

[56] References Cited

U.S. PATENT DOCUMENTS

| | | | |
|---|---|---|---|
| 4,486,711 | 12/1984 | Frese et al. ........................... | 324/319 |
| 4,646,024 | 2/1987 | Schenck et al. ...................... | 324/318 |
| 4,725,803 | 2/1988 | Prevot et al. ......................... | 324/320 |
| 4,740,772 | 4/1988 | Prevot ................................... | 324/320 |
| 4,833,410 | 5/1989 | Briguet et al. ........................ | 324/318 |
| 4,924,186 | 5/1990 | Kawamoto et al. .................. | 324/320 |

FOREIGN PATENT DOCUMENTS

| | | |
|---|---|---|
| 0221810 | 5/1987 | European Pat. Off. . |
| 0243270 | 10/1987 | European Pat. Off. . |
| 0274149 | 7/1988 | European Pat. Off. . |
| 2170957 | 8/1986 | United Kingdom . |

Primary Examiner—Michael J. Tokar
Attorney, Agent, or Firm—Hill, Van Santen, Steadman & Simpson

[57] ABSTRACT

A gradient coil system for a nuclear magnetic resonance tomography apparatus has main x and y coils, which are split arc saddle coils. The coil arcs are split so that their coupling increases with increasing distance from the plane of symmetry. The x and y main coils have respective x and y auxiliary coils allocated to them, which are also saddle coils and which have an aperture angle less than 90°, and which are arranged on the same cylindrical surface. The characteristics of the elementary saddle coils which define the gradient coil field are matched so that the noise terms of the series development of the gradient field are at least partially eliminated.

3 Claims, 3 Drawing Sheets

GRADIENT COIL SYSTEM FOR A NUCLEAR RESONANCE TOMOGRAPHY APPARATUS

BACKGROUND OF THE INVENTION

1. Field of the Invention

The present invention is directed to a gradient coil system for use in a nuclear magnetic resonance tomography apparatus, the gradient coil system having a symmetry plane in the x-y plane of a rectangular x-y-z coordinate system, with the z-axis proceeding in the direction of the fundamental magnetic field $B_z$.

2. Description of the Prior Art

In nuclear magnetic resonance tomography devices (also referred to as magnetic resonance imaging devices), it is known to use a saddle coil arrangement to generate an x-gradient field and to use a saddle coil arrangement to generate a y-gradient field, with respect to a fundamental magnetic field $B_z$. These saddle coil arrangements each contain four main coils, which are composed of saddle coils having divided inner arcs (split arc saddle coils) arranged on cylindrical generated surfaces. The main coils each consist of two elementary saddle coils, one inside the other. Each elementary saddle coil contains a front arc facing toward the x-y plane having a distance Z from the x-y plane, and a rear arc having a distance H from the x-y plane. The arcs are connected to each other by straight conductors proceeding in the z-direction. The position of these conductors is defined by an angle $\phi$ in the x-y plane. The straight conductors of the two elementary saddle coils are disposed approximately against each other. The rear arcs of the two elementary saddle coils are also disposed approximately against each other. Each elementary saddle coil has a predetermined amperage.

The nuclear magnetic resonance imaging device in which such a gradient coil system is used contains a fundamental field magnet system which aligns the nuclear spins in an examination subject, and also contains a RF system for exciting nuclear spins in the examination subject, and for acquiring the signals emitted by the excited spinning nuclei. The gradient fields generated by the gradient coil system are required for selecting a slice of the examination subject which is to be imaged, and for the spatial allocation of the signals in the slice. The gradient coil system contains gradient coils which generate a magnetic field proceeding in the direction of the fundamental field, changing linearly in this direction. Further gradient coils generate respective magnetic fields proceeding in the direction of the fundamental field which respectively change in two directions perpendicular to the direction of the fundamental field. By selectively operating these gradient coils, the phase of the signal induced in the RF system following the generation of the fundamental field is influenced dependent on the distribution of nuclear spins in the examination region. It is thus possible to generate an image of a slice plane of the examination subject based on the distribution of nuclear spins.

In addition to the fundamental field $\vec{B} = B_0 \vec{e}_z$ and an RF field $\vec{B}_{x,y}$, the gradient fields, which can be switched independently of each other, are required for generating a nuclear magnetic resonance image. These gradient fields are optimally linear gradient fields of the form:

$$G_x = \frac{\partial B_z}{\partial x} ; \quad G_Y = \frac{\partial B_z}{\partial y} \text{ and } G_Z = \frac{\partial B_z}{\partial z}.$$

The y-gradient field is difficult to produce because it is not dynamically balanced. The x-gradient field is generated by a coil system which is identical to the y-gradient coil system, but is rotated by 90° about the z-axis. The effective z-component of the y-gradient field can best be represented by a series expansion according to spherical functions:

$$B_z(r,\upsilon,\phi) = G_y R \sum_{n=1,3\ldots}^{\infty} (r/R)^n \cdot \sum_{m=1,3\ldots}^{n} C(n,m) \overline{P}_n^M (\cos\upsilon) (\sin m\phi).$$

The specific symmetry only permits uneven indices and sineterms. In the above expansion, n is the degree of the Legendre polynomial expansion, m is the order of the Legendre polynomial expansion, $r = (x^2 + y^2 + z^2)^{\frac{1}{2}}$, $\phi$ is the angle of the incident point relative to the x-axis, $\upsilon$ is the angle of the incident point relative to the z-axis, R is the radius of the imaging region, $G_y$ is the gradient strength, for example about 1 to 10 mT/m, $\overline{P}_n^M$ is the associated normalized Legendre polynomial expansion, and $C(n,m)$ is the development coefficient, which equals the relative amplitudes of the field contribution of the type (n,m).

The normalizing of the Legendre polynomial expansion $\overline{P}_n^M$ is selected so that it can assume maximum values of about 1. The development coefficients $C(n,m)$ then approximately represent the maximum value for points on a spherical surface having the radius R.

An ideal $G_Y$ coil system would only provide a coefficient $C(1,1) = 1.1545$. Because the space relationships in a fundamental field magnet for nuclear magnetic resonance tomography are extremely tight, the gradient coils are generally constructed on cylindrical carrier members having a finite length. Higher noise terms $C(n,m)$, with $n>1$, and $m>1$ arise as a result. The values having low n and m are particularly disturbing because they only decrease toward the center with the $n^{th}$ power of r. Disturbances having a high degree of n are more acceptable because they only take effect at the edge of the useful volume. A design of the gradient coils is thus needed wherein many development coefficients $C(n,m)$ are zero given a constant $C(1,1)$.

A known nuclear magnetic resonance tomography apparatus contains a system of gradient coils which simulates a hollow cylinder having the radius $\pi$ and having a cylinder axis proceeding in the z-direction of a rectangular x-y-z coordinate system which has its origin in the center of an imaging region. The magnetic field $B_Z$ of a fundamental field magnet also proceeds in this direction. At least two annular individual coils, symmetrically arranged relative to the x-y plane and traversed by current in opposite directions, are provided for generating a z-gradient which is at least approximately constant in the imaging region. The gradient coil system also includes at least one set of pairs of saddle-shaped individual coils arranged substantially symmetrically relative to the symmetry plane, which generate a substantially constant x-gradient $$G_x = \frac{\partial B_z}{\partial y}$$

and a corresponding y-gradient $$G_y = \frac{\partial B_z}{\partial y}$$

in the imaging region. These saddle coils each contain straight coil portions proceeding in the z-direction as well as coil portions proceeding as azimuthally relative to the z-axis in the circumferential direction of the cylinder. The directions of current conduction are the same in those coil portions of the two elementary saddle coils which neighbor one another. The directions of current conduction, however, are the same in the corresponding arc-shaped coil portions of the other coil pair which are symmetrically arranged relative to the symmetry plane. The coil arcs are arranged at predetermined distances from the symmetry plane, and the coupling in the coil arcs becomes higher with increasing distance from the symmetry plane. Significant noise terms C are eliminated by this splitting of those coils which are immediately adjacent the symmetry plane (split arc saddle coils). Such a coil system is described in U.S. Pat. No. 4,486,711.

SUMMARY OF THE INVENTION

It is an object of the present invention to provide a gradient coil system in a nuclear magnetic resonance tomography apparatus of the type described above formed by saddle-shaped main coils, wherein further noise terms of the gradient fields are eliminated.

The above object is achieved in a gradient coil system constructed in accordance with the principles of the present invention wherein the main y-coils each have a pair of y-auxiliary coils, formed by saddle coils, allocated thereto, and the main x-coils each have a pair of x-auxiliary coils, also formed by saddle coils allocated thereto. The aperture angle of these auxiliary coils is less than 90° and all of the auxiliary coils are arranged on the same cylinder surface. The auxiliary coils are respectively arranged angularly centered relative to the allocated main coil. The quantities which define the gradient field for each elementary saddle coil of the main coils and of the auxiliary coils are matched so that the noise terms C(n,m) of the series development of the gradient field are substantially eliminated.

DESCRIPTION OF THE PREFERRED EMBODIMENTS

Figure 1:
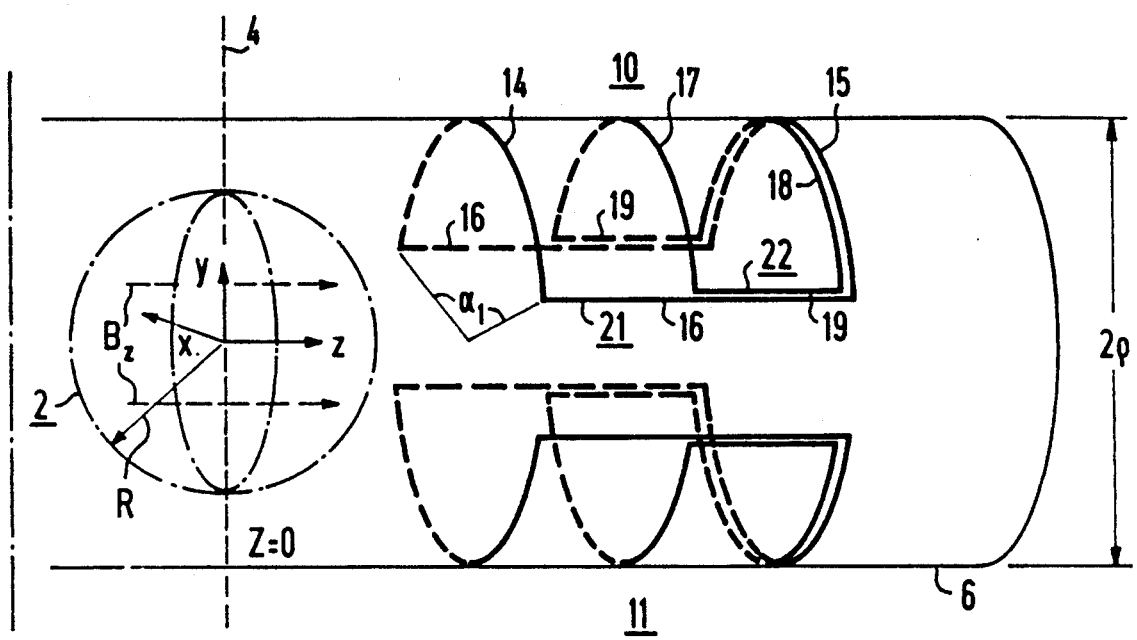
FIG. 1 is a drawing of a conventional gradient coil system, shown relative to a spherical coordinate system.

A known gradient coil system is shown in FIG. 1, together with two reference coordinate systems, for the purpose of explaining the background of the invention. The gradient coil system of FIG. 1 is for use in a nuclear magnetic resonance tomography apparatus which has a magnet, constructed in a known manner and thus not shown in FIG. 1, which is preferably a superconducting magnet and which generates a fundamental magnetic field $B_z$ in the z-direction of a rectangular x-y-z coordinate system.

The known gradient coil system generates approximately constant magnetic field gradients in an imaging region 2, which is assumed to be substantially spherical, having a radius R. The origin of the coordinates of the coordinate system is situated in the center of the imaging region 2. An examination subject, such as a human body, is introduced into the magnetic field $B_z$ along the z-axis. Excitation of nuclear spins in the examination subject is undertaken in a known manner by generating a RF field using an RF antenna (not shown) oriented perpendicularly relative to the z-axis. The RF antenna may simultaneously serve as a receiver for acquiring the resulting nuclear magnetic resonance signals.

For generating the z-gradient, the gradient coil system should preferably contain annular coils (not shown in FIG. 1) having a diameter 2 p which are respectively arranged in a known manner at both sides of a symmetry plane, i.e., the x-y plane, which is indicated with dashed lines in FIG. 1 and is referenced 4. The gradient coil system further includes gradient coils for generating an x-gradient and a y-gradient field. For clarity, however, only a portion of the sub-system disposed at the right of the symmetry plane 4, which generates the y-gradient field, is shown in an oblique view. Covered semiconductor components are indicated in FIG. 1 with dashed lines. The gradient coil system is used to generated approximately linear gradient fields in the y-direction includes two pairs of main y-coils, with only that pair arranged at the right of the symmetry plane 4 being shown in FIG. 1, referenced 10 and 11. These main y-coils 10 and 11 are disposed symmetrically relative to the x-z plane on a hollow cylindrical carrier 6. The carrier 6 has a radius p for example of 0.37 m, and has a cylinder axis proceeding in the z-direction of the illustrated coordinate system in the imaging region 2. The effective fundamental field $B_z$ is this region is approximately homogeneous.

To guarantee linearity of the gradient fields, for example, of the y-gradient field, which is sufficient to satisfy the homogeneity demands of nuclear magnetic resonance technology, the main y-coil 10 contains two elementary saddle coils 21 and 22 having a predetermined amperage. The length of the coil arcs 14 and 15 is preferably selected so that an aperture angle $\alpha_1$ results which is between 121° and 134°. The coil arcs 14 and 15 are connected to each other by straight conductor portions 16 extending in the z-direction, thereby forming the elementary saddle coil 21. The elementary saddle coil 22 is formed in the same manner by straight coil portions 19 connecting coil arcs 17 and 18. These two elementary saddle coils 21 and 22 are disposed with the elementary coil 22 inside the elementary coil 21, and are preferably electrically connected in series. The other main y-coil 11 is constructed in the same way.

Figure 2:
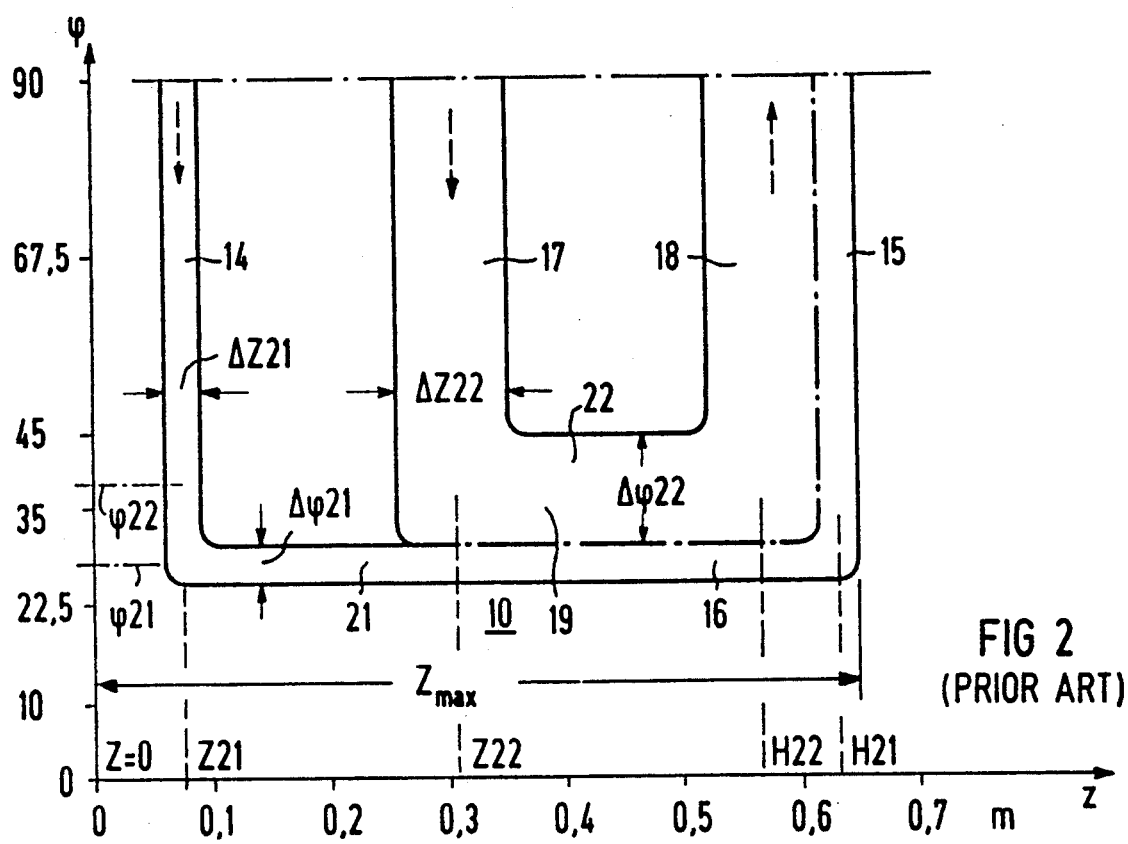
FIG. 2 is a view of the conventional system of FIG. 1 in the small z, $\phi$ coordinates.

Because the main y-coils 10 and 11 are symmetrically arranged relative to the y-z plane, a developed view in z-$\phi$ coordinates of one-half of the main coil, shown in FIG. 2, suffices for further explanation. The angle $\phi$ is the angle made relative to the x-axis. As noted above, the main y-coil is composed of the elementary saddle coils 21 and 22. For the following calculations, a system length of two $Z_{max} = 1.30$ m and ampere turns AT of about 2 AT/cm are assumed. The widths $\Delta\phi 21$ and $\Delta\phi 22$ as well as $\Delta Z21$ and $\Delta Z22$ of the elementary saddle coils arise from the necessary ampere turns AT. The spatial position of the front coil arc 14 of the elementary saddle coil 21 is established by a mean spacing Z21 from the x-y plane, and the position of the front coil arc 17 of the elementary saddle coil 22 is established in the same way by a mean spacing Z22 from the x-y plane (z=0). The respective spacing of the rear coil arcs 15 and 18 of the elementary saddle coils are referenced H21 and H22.

In accordance with the principles of the invention, two y-auxiliary coils 23 and 24, which are also saddle-shaped, are respectively allocated to the main y-coils 10 and 11. The aperture angle $\alpha_3$ is less than 90°. The position of the straight conductor portions of the y-auxiliary coil 23 and thus the length of the coil arcs, are defined by the angle $\alpha_3$ taken along the x-axis. The angle $\alpha_3$ is greater than the angle $\phi_1$ of the main coil 10. The y-auxiliary coils 23 and 24 are preferably arranged on an imaginary cylindrical surface whose radius $\phi_3$ is only slightly greater than the radius $p_1$ of the main y-coils 10 and 11.

In a special embodiment of the gradient coil system, x-auxiliary coils 25 and 26 (shown in FIG. 3) which are allocated to the main x-coils 12 and 13 for generating the x-gradient, can also be arranged in the same cylinder plane having the radius $p_3$.

Calculations for the main coil shown in FIG. 2 can be undertaken in a simple manner based on the conductor arc having an angle $\phi$ and from the straight coil portions proceeding in the direction of the z-axis. For a cylinder radius of, for example, p=0.37 m, coil data for the y-gradient system as recited in Table I result for the embodiment of the elementary saddle coil 21 having the coil arcs 14 and 15 and a system length of $Z_{max}=0.65$ m and ampere turns of about 2 AT/cm and a useful gradient G = 1 mT/m.

In Table I, AT21 = 70.9 identifies the ampere turns of the elementary saddle coil 21, and AT22 = 191.4 identifies the ampere turns of the elementary saddle coil 22. The distance Z21 = 75.4 mm is the distance of the front arc 14 from the x-y plane (z=0) and Z22 = 305 mm is the distance of the arc 17 from the x-y plane (z=0). The spacings H21 and H22 of the rear arcs and the angles $\phi 21$ and $\phi 22$ of the straight conductor portions 16 and 19 are also shown. Further, the spectrum of the noise terms having the development coefficients C(n,m) in normalized spherical functions is shown in percent with reference to a radius R=0.25 m of the imaging region 2. The noise terms C(5,1) and C(7,1) are already eliminated with this known embodiment of the main y-coil 10.

Figure 4:
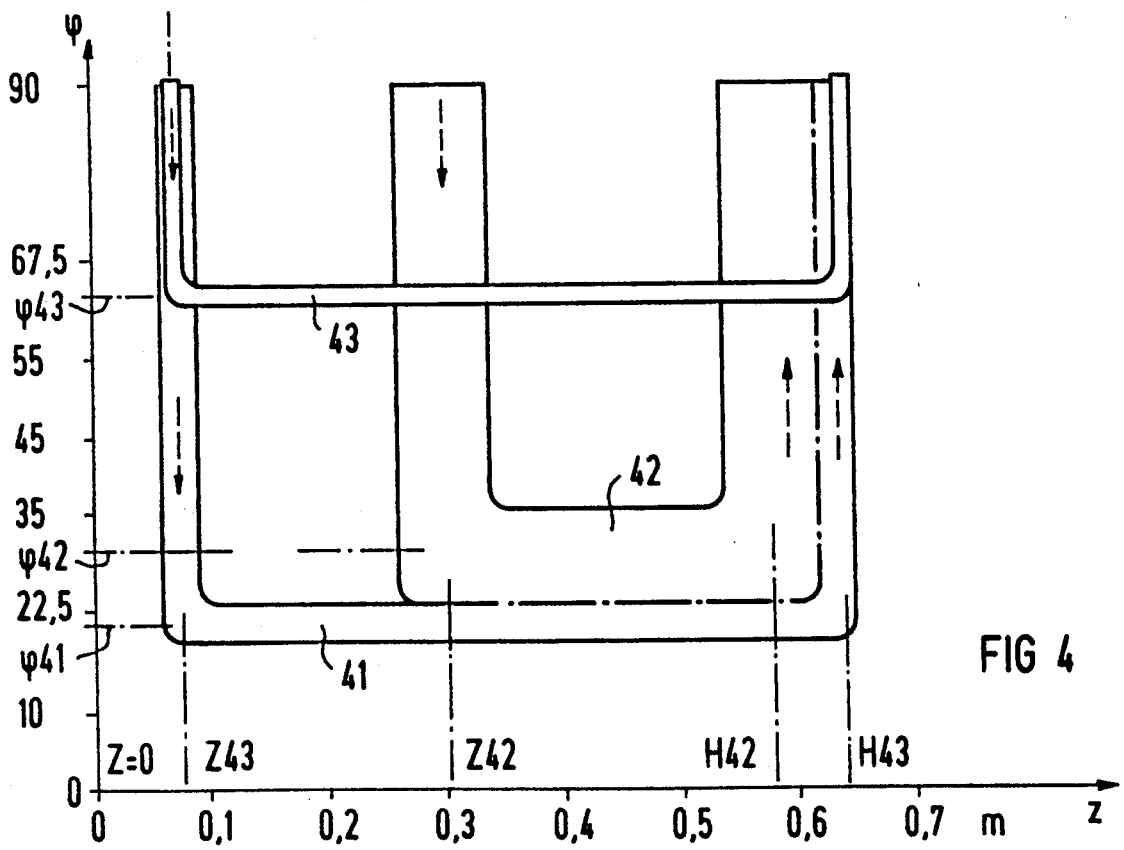
FIG. 4 shows the embodiment of FIG. 3 in a developed view in the z, $\phi$ coordinates.

In accordance with the invention, the further noise terms C(5,3) and C(5,5) can be eliminated with an elementary coil 43 which represents a y-auxiliary coil 23 or 24 as shown in FIG. 4. As can be seen from Table II, this elementary saddle coil has ampere turns AT43=25.2 and a position Z43=76.2 mm and H43=643.7 and an angle $\phi 43 = 62.58°$. The dimensioning of main y-coil changes in comparison to the embodiment of FIG. 2. The elementary saddle coil 41 has ampere turns AT41=54.2 and a position Z41=74.9 mm and an angle $\phi 41=20.98°$. The noise terms C(5,3), C(5,5) and C(7,3) are also eliminated with this embodiment.

Figure 5:
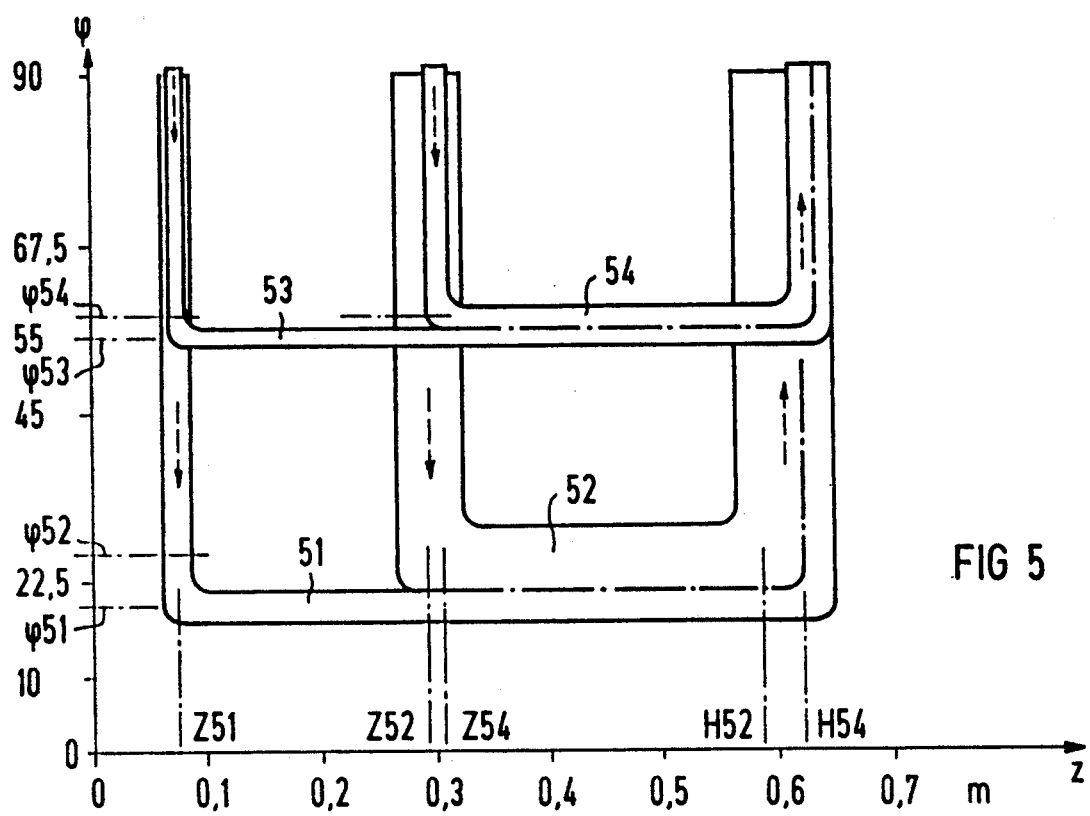
FIG. 5 shows a further embodiment of a gradient coil system constructed in accordance with the principles of the present invention in a developed view in the z, $\phi$ coordinates.

In the embodiment of FIG. 5, elementary saddle coils 53 and 54 are provided as the auxiliary coil, with coil 54 being disposed within coil 53. As can be seen from Table III, in this embodiment the ampere turns AT53=28 for the coil 53, which has an angle $\phi 53=55.10°$ which is slightly smaller than the angle $\phi 54=57.63°$. The dimensions and numbers of ampere turns of the elementary saddle coils 51 and 52 are again modified in comparison to the embodiment of FIG. 4. The noise terms C(7,5) and C(7,7) can be eliminated in this embodiment. A coil system for the y-gradient having error terms which begin at n=9 of the spherical functions is thus obtained. The system error is defined by the noise term C(9,1)= −1.21. The image distortion arising as a result thereof is only about 1% at the edge of the imaging region 2, and decreases with the ninth power of the distance from the center.

Figure 6:
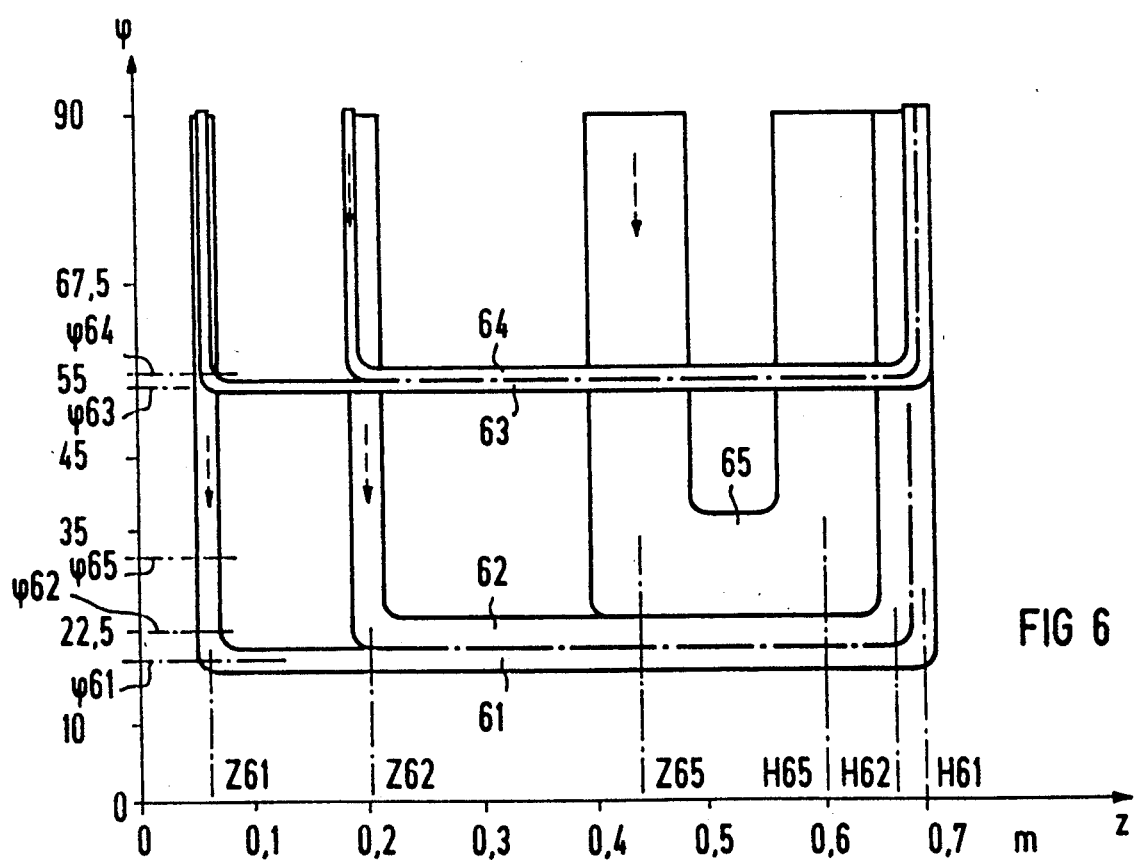
FIG. 6 shows another embodiment of a gradient coil system constructed in accordance with the principles of the present invention in a developed view in the z, $\phi$ coordinates.

In the embodiment shown in FIG. 6, a supplementary coil 65 having ampere turns AT65=247 as shown in Table V is added to the elementary saddle coils 61 and 62 and the elementary coil saddles 63 and 64 of the auxiliary coil. The supplementary coil 65 is placed relative to the elementary saddle coil 62 so that its rear arc is approximately against the rear arc of the elementary saddle coil 62, and the straight conductor portions of the auxiliary coil 65 are approximately against the straight conductor portions of the elementary saddle coil 62. The coil 65 is arranged in the same cylindrical surface as the elementary saddle coil 61 and 62 of the main coil. In this embodiment of a gradient coil system, essentially only the term C(9,9)= −0.22 remains as system error as shown in Table IV. This results in a maximum geometrical image distortion of only about 0.2%.

Figure 3:
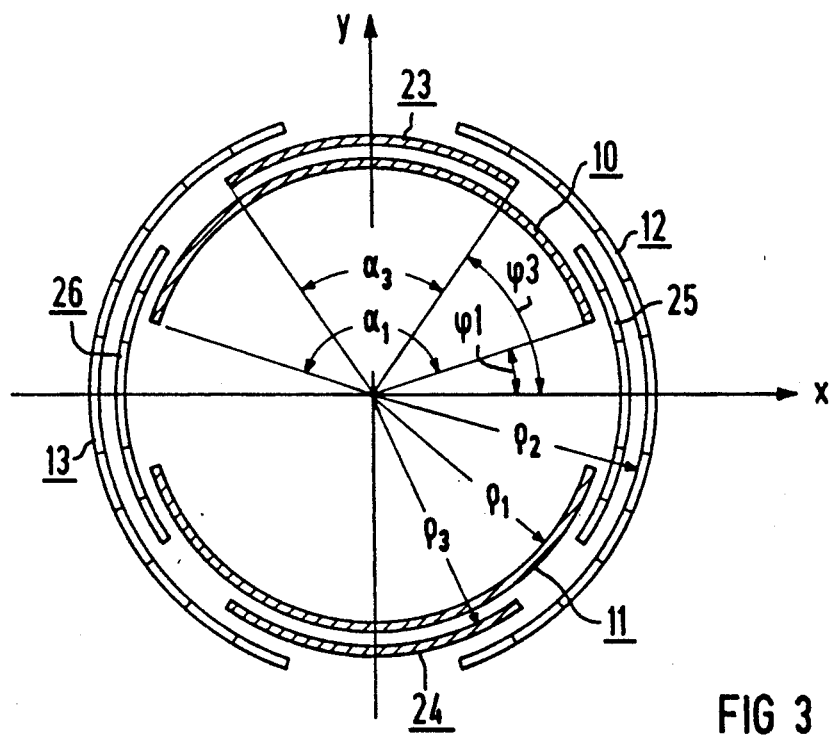
FIG. 3 is an embodiment of a gradient coil system constructed in accordance with the principles of the present invention seen in a section perpendicular to the z-axis of the coordinate system.

As can be seen from the sectional view in FIG. 3, the main y-coils 10 and 11 and the y-auxiliary coils 23 and 24 for generating the y-gradient are arranged in two different cylindrical surfaces of the carrier 6. The x-auxiliary coils 25 and 26 for the x-gradient are also arranged in the cylindrical surface of the y-auxiliary coils 23 and 24. The main x-coils 12 and 13 for the x-gradient are arranged in a third, coaxial imaginary cylindrical surface. This results in a three-shell format for a gradient coil system of the ninth order with only a slight added space requirement.

In the embodiment shown in FIG. 3, the main y-coils 10 and 11 are arranged on the smaller cylinder radius $\pi_1$ and the main x-coils 12 and 13 are arranged on the larger cylinder radius $p_2$. Somewhat higher numbers of ampere turns AT are thus required for the main x-coils 12 and 13. The arrangement of these coils, however, can be interchanged and the main x-coils could be arranged on the smaller cylinder radius $p_1$.

The numerical values shown in the tables are based on the assumed coil radius p=0.37 m and an assumed gradient field strength G=1 mT/m. For a different radius p' and a different gradient strength G', the data for the elementary saddle coils shown in the tables are modified according to the following scaling rules:

$AT' = AT(p'/p)^2 (G'/G)$ $\phi' = \phi$ $Z' = Z(p'/p)$ $H' = H(p'/p)$.

To simplify the explanation, the arrangement of gradient coils on the carrier 6 has been assumed in the exemplary embodiment. Under certain circumstances, however, it may be preferable to unit the gradient coil system to form a self-supporting structural unit. A separate carrier element would then not be needed.

TABLE I
(For FIG. 2)

| y-Gradient Fields | | Spectrum n,m | C (n,m) [%] |
|---|---|---|---|
| AT 21 | 70.9 AT/cm | 1,1 | 115.45 |
| Z 21 | 75.4 mm | 3,1 | 0.00 |
| H 21 | 632.3 mm | 3,3 | 0.00 |
| $\phi$ 21 | 28.42° | 5,1 | 0.00 |
| AT 22 | 191.4 AT/cm | 5,3 | −1.33 |
| Z 22 | 305.0 mm | 5,5 | −2.98 |
| H 22 | 566.0 mm | 7,1 | 0.00 |
| $\phi$ 22 | 38.82° | 7,3 | −0.05 |
| | | 7,5 | −0.24 |
| | | 7,7 | −1.11 |
| | | 9,1 | −1.17 |
| | | 9,3 | 0.14 |
| | | 9,5 | 0.12 |
| | | 9,7 | 0.14 |
| | | 9,9 | 0.16 |

TABLE II
(For FIG. 4)

| y-Gradient Fields | | Spectrum n,m | C (n,m) [%] |
|---|---|---|---|
| AT 41 | 54.2 AT/cm | 1,1 | 115.45 |
| Z 41 | 74.9 mm | 3,1 | 0.00 |
| H 41 | 636.7 mm | 3,3 | 0.00 |
| $\phi$ 41 | 20.98° | 5,1 | 0.00 |
| AT 42 | 163.4 AT/cm | 5,3 | 0.00 |
| Z 42 | 300.3 mm | 5,5 | 0.00 |
| H 42 | 582.0 mm | 7,1 | 0.00 |
| $\phi$ 42 | 29.55° | 7,3 | 0.00 |
| AT 43 | 25.2 AT/cm | 7,5 | −0.29 |
| Z 43 | 76.2 mm | 7,7 | −0.57 |
| H 43 | 643.7 mm | 9,1 | −1.23 |
| $\phi$ 43 | 62.58° | 9,3 | −0.03 |
| | | 9,5 | −0.13 |
| | | 9,7 | 0.01 |
| | | 9,9 | −0.33 |

TABLE III
(For FIG. 5)

| y-Gradient Fields | | Spectrum n,m | C (n,m) [%] |
|---|---|---|---|
| AT 51 | 48.6 AT/cm | 1,1 | 115.45 |
| Z 51 | 75.1 mm | 3,1 | 0.00 |
| H 51 | 637.9 mm | 3,3 | 0.00 |
| $\phi$ 51 | 18.68° | 5,1 | 0.00 |
| AT 52 | 128.1 AT/cm | 5,3 | 0.00 |
| Z 52 | 293.8 mm | 5,5 | 0.00 |
| H 52 | 594.5 mm | 7,1 | 0.00 |
| $\phi$ 52 | 29.49° | 7,3 | 0.00 |
| AT 53 | 28.0 AT/cm | 7,5 | 0.00 |
| Z 53 | 74.4 mm | 7,7 | 0.00 |
| H 53 | 642.9 mm | 9,1 | −1.21 |
| $\phi$ 53 | 55.10° | 9,3 | 0.02 |
| AT 54 | 37.1 AT/cm | 9,5 | −0.03 |
| Z 54 | 303.1 mm | 9,7 | 0.12 |
| H 54 | 626.7 mm | 9,9 | 0.22 |
| $\phi$ 54 | 57.63° | | |

TABLE IV
(For FIG. 6)

| y-Gradient Fields | | Spectrum n,m | C (n,m) [%] |
|---|---|---|---|
| AT 61 | 37.8 A | 1,1 | 115.45 |
| Z 61 | 60.1 mm | 3,1 | 0.00 |
| H 61 | 690.5 mm | 3,3 | 0.00 |
| $\phi$ 61 | 18.14° | 5,1 | 0.00 |
| AT 62 | 53.4 A | 5,3 | 0.00 |
| Z 62 | 199.7 mm | 5,5 | 0.00 |
| H 62 | 667.0 mm | 7,1 | 0.00 |
| $\phi$ 62 | 21.83° | 7,3 | 0.00 |
| AT 63 | 21.9 A | 7,5 | −0.03 |
| Z 63 | 57.3 mm | 7,7 | 0.00 |
| H 63 | 667.0 mm | 9,1 | 0.00 |
| $\phi$ 63 | 54.56° | 9,3 | 0.01 |
| AT 64 | 22.3 A | 9,5 | −0.02 |
| Z 64 | 190.0 mm | 9,7 | 0.05 |
| H 64 | 685.0 mm | 9,9 | −0.22 |
| $\phi$ 64 | 56.13° | | |
| AT 65 | 247.5 A | | |
| Z 65 | 442.5 mm | | |
| H 65 | 610.5 mm | | |
| $\phi$ 65 | 31.67° | | |

Although modifications and changes may be suggested by those skilled in the art, it is the intention of the inventor to embody within the patent warranted hereon all changes and modifications as reasonably and properly come within the scope of his contribution to the art.

I claim as my invention:

1. A gradient coil system for a nuclear magnetic resonance tomography apparatus, said apparatus including means for generating a fundamental magnetic field, in a volume, in the direction of the z-axis of an x-y-z coordinate system, said gradient coil system having a symmetry plane in the x-y plane of said x-y-z coordinate system and comprising:

first saddle coil means for generating an x-gradient field in said volume and second saddle coil means for generating a y-gradient field in said volume;

each of said first and second saddle coil means containing four main coils which are split arc saddle coils arranged on the same imaginary cylindrical surface having a radius p;

each of said main coils of said first and second saddle coil means consisting of two elementary saddle coils one inside the other;

each elementary saddle coil having a front coil arc substantially parallel to said x-y plane and spaced a distance Z therefrom, a rear coil arc substantially parallel to said x-y plane and spaced a distance H therefrom, and two straight coil sections connecting said front and rear coil arcs, said straight coil sections extending in the z-direction and defining an aperture angle $\alpha$ therebetween in the x-y plane and an angle $\phi$ in the x-y plane relative to the x-axis, and each elementary saddle coil having a predetermined number of ampere turns AT;

said straight coil sections and said rear arcs of the two elementary coils forming each main coil being disposed substantially against each other;

a pair of auxiliary saddle coils allocated to each of the main coils of each of said first and second saddle coil means;

each auxiliary saddle coil having a front auxiliary coil arc substantially parallel to said x-y plane and spaced a respective distance $Z_{aux}$ therefrom, a rear auxiliary coil arc substantially parallel to said x-y plane and spaced a respective distance $H_{aux}$ therefrom, and two straight auxiliary coil sections connecting said front and rear auxiliary coil arcs, said straight auxiliary coil sections extending in the z-direction and defining a respective auxiliary coils aperture angle $\alpha_{aux}$ therebetween and a respective angle $\phi_{aux}$ in the x-y plane relative to the x-axis, and each auxiliary saddle coil having a respective predetermined number of ampere turns $AT_{aux}$;

said straight auxiliary coil section and said rear auxiliary arcs of the auxiliary saddle coils forming a pair being disposed substantially against each other;

each of said auxiliary coil arcs being disposed on a same further imaginary cylindrical surface having a radius $\rho_{aux}$, with $\rho \neq \rho_{aux}$;

each of said auxiliary coils being angularly centered relative to the main coil allocated thereto; and the quantities AT, Z, H and $\phi$ which define the gradient field for each of said elementary saddle coils forming said main coils and the respective quantities $AT_{aux}$, $Z_{aux}$, $H_{aux}$, and $\phi_{aux}$ which define the gradient field for each auxiliary coil being matched to each other so that noise terms C(n,m) of a series development of said gradient fields are substantially eliminated.

2. A gradient coil system as claimed in claim 1, wherein each of said auxiliary coils is a split arc saddle coil.

3. A gradient coil system as claimed in claim wherein the elementary saddle coil of each main coil which is inside the other elementary saddle coil of that main coil is defined as the inner elementary saddle coil, and wherein each of said main coils of said first and second saddle coil means further contains a supplementary saddle coil having front and rear supplementary coil arcs arranged on said imaginary cylindrical surface having a radius $\rho$, said front and rear supplementary coil arcs of each supplementary coil being connected by a straight supplementary coil section extending in the direction of said z-axis, and the rear supplementary coil arc and the straight supplementary coil sections being disposed respectively substantially against the rear coil arc and the straight coil sections of said inner elementary coil of each main coil.

* * * * *